US011111131B2

United States Patent
Zou

(10) Patent No.: US 11,111,131 B2
(45) Date of Patent: Sep. 7, 2021

(54) MEMS MICROPHONE, A MANUFACTURING METHOD THEREOF AND AN ELECTRONIC APPARATUS

(71) Applicant: GOERTEK. INC, Shandong (CN)

(72) Inventor: Quanbo Zou, Shandong (CN)

(73) Assignee: GOERTEK INC, Weifang (CN)

( * ) Notice: Subject to any disclaimer, the term of this patent is extended or adjusted under 35 U.S.C. 154(b) by 8 days.

(21) Appl. No.: 16/619,980

(22) PCT Filed: Jun. 9, 2017

(86) PCT No.: PCT/CN2017/087771
§ 371 (c)(1),
(2) Date: Dec. 6, 2019

(87) PCT Pub. No.: WO2018/223389
PCT Pub. Date: Dec. 13, 2018

(65) Prior Publication Data
US 2021/0078856 A1  Mar. 18, 2021

(51) Int. Cl.
*H04R 19/00* (2006.01)
*B81B 3/00* (2006.01)
(Continued)

(52) U.S. Cl.
CPC ............ *B81B 3/0018* (2013.01); *H04R 19/04* (2013.01); *H04R 31/006* (2013.01);
(Continued)

(58) Field of Classification Search
CPC ........ H04R 19/04; H04R 19/005; H04R 1/04; H04R 1/06; H04R 2201/003; H04R 31/006; B81C 1/0023; B81C 2203/0154; H01L 2924/1461; H01L 2224/48227; B81B 2201/012; B81B 2201/0257; B81B 2201/0264; B81B 3/0018; B81B 2203/0127
See application file for complete search history.

(56) References Cited

U.S. PATENT DOCUMENTS 8,447,057 B2  5/2013  Goida et al.
9,438,972 B2  9/2016  Wang et al.
(Continued)

FOREIGN PATENT DOCUMENTS

CN  203225885 U  10/2013
CN  103491490 A   1/2014
(Continued)

OTHER PUBLICATIONS

International Search Report received in International Application No. PCT/CN2017/087771 dated Mar. 8, 2018.

*Primary Examiner* — Matthew A Eason
(74) *Attorney, Agent, or Firm* — Ajay A. Jagtiani; Miles & Stockbridge P.C.

(57) ABSTRACT

A MEMS microphone, a manufacturing method thereof and an electronic apparatus are disclosed. The MEMS microphone comprises: a MEMS microphone device including a MEMS microphone chip and a mesh membrane monolithically integrated with the MEMS microphone chip; and a housing including an acoustic port, wherein the MEMS microphone device is mounted in the housing, and the mesh membrane is arranged between the MEMS microphone chip and the acoustic port as a particle filter for the MEMS microphone chip.

10 Claims, 4 Drawing Sheets

(51) Int. Cl.
*H04R 19/04* (2006.01)
*H04R 31/00* (2006.01)

(52) U.S. Cl.
CPC ............ *B81B 2201/0257* (2013.01); *B81B 2203/0127* (2013.01); *B81B 2207/012* (2013.01); *H04R 2201/003* (2013.01)

(56) References Cited

U.S. PATENT DOCUMENTS

| | | |
|---|---|---|
| 2009/0101998 A1 | 4/2009 | Fen et al. |
| 2012/0237073 A1 | 9/2012 | Goida et al. |
| 2014/0064542 A1 | 3/2014 | Bright et al. |
| 2016/0345084 A1 | 11/2016 | Friza et al. |

FOREIGN PATENT DOCUMENTS

| | | |
|---|---|---|
| CN | 104254045 A | 12/2014 |
| CN | 102685657 A | 9/2017 |

MEMS MICROPHONE, A MANUFACTURING METHOD THEREOF AND AN ELECTRONIC APPARATUS

CROSS-REFERENCE TO RELATED APPLICATIONS

This application is a National Stage of International Application No. PCT/CN2017/087771 filed on Jun. 9, 2017 which is hereby incorporated by reference in its entirety.

FIELD OF THE INVENTION

The present invention relates to the technical field of a MEMS microphone, and more specifically, to a MEMS microphone, a method for manufacturing a MEMS microphone and an electronic apparatus.

BACKGROUND OF THE INVENTION

A Micro-Electro-Mechanical System, or MEMS, is a technology that in its most general form can be defined as miniaturized mechanical and electro-mechanical elements (i.e., devices and structures) that are made using the techniques of micro-fabrication. Generally, a MEMS element is made by the MEMS technology and then is encapsulated into a MEMS device. The MEMS device can further be assembled into an electronics apparatus such as a mobile phone, a pad, a laptop, sensor and so on. An example of a MEMS device may include a MEMS microphone.

Generally, a MEMS microphone includes a MEMS microphone chip, an ASIC chip and a housing. The MEMS microphone chip is used to sense a sound pressure and transform it into an electrical signal. The ASIC chip is used to process the electrical signal. The MEMS microphone chip and the ASIC chip are enclosed in the housing. Generally, the housing has an acoustic port to let the sound pressure come into the MEMS microphone chip and interact with its diaphragm.

The housing can include a package substrate and a lid. The acoustic port may be placed in either of the substrate and the lid.

Because the acoustic port is open and communicates with outside environment, the MEMS microphone suffers from external interferences such as particles.

Generally, a filter may be added to the package substrate or a PCB for the MEMS microphone to filter particles. A fine filter cannot be provided due the limitation of manufacturing process capability. Furthermore, the package size of the microphone may be increased.

In a prior art solution, a mesh-structured back hole is added at a MEMS die level. The mesh-structured back hole is formed form the bottom side of a silicon substrate using a controlled deep reactive ion etching process. This solution may degrade the performance the MEMS microphone, or complicate the manufacturing process, which may lead to yield, cost and reliability concerns.

U.S. Pat. No. 9,438,972 B2 discloses a Silicon based MEMS microphone, a system and a package with the same, which is hereby incorporated herein by reference.

CN patent publication No. 203225885 U discloses a MEMS microphone, which is hereby incorporated herein by reference.

U.S. Pat. No. 8,447,057 B2 discloses packages and methods for packaging MEMS microphone devices, which is hereby incorporated herein by reference.

Therefore, there is a demand in the art that a new solution for a MEMS microphone shall be proposed to address at least one of the problems in the prior art.

SUMMARY OF THE INVENTION

One object of this invention is to provide a new technical solution for a MEMS microphone.

According to a first aspect of the present invention, there is provided a MEMS microphone, comprising: a MEMS microphone device including a MEMS microphone chip and a mesh membrane monolithically integrated with the MEMS microphone chip; and a housing including an acoustic port, wherein the MEMS microphone device is mounted in the housing, and the mesh membrane is arranged between the MEMS microphone chip and the acoustic port as a particle filter for the MEMS microphone chip.

Alternatively or optionally, the MEMS microphone chip includes a first substrate, at least one backplate and at least one diaphragm, and the mesh membrane is formed on a second substrate; and wherein the mesh membrane and the second substrate are bonded to the first substrate.

Alternatively or optionally, the mesh membrane and the second substrate are bonded to the first substrate by at least one of wafer bonding, fusion bonding and intermediate layer bonding.

Alternatively or optionally, the housing includes a package substrate and a lid, which form a housing cavity, and the acoustic port is in the package substrate.

Alternatively or optionally, the mesh membrane has a perforation hole size of 1-10 um, and the mesh membrane has a thickness in range of 0.1-10 um.

Alternatively or optionally, a hole array in the mesh membrane is 60deg placed.

Alternatively or optionally, a material of the mesh membrane is at least one of SixNy, polySi, metal, alloy and polymer.

According to a second aspect of the present invention, there is provided a method for manufacturing a MEMS microphone, including: preparing a MEMS microphone wafer, wherein the sacrificial layer between a diaphragm and a backplate of the MEMS microphone wafer are not released; preparing a mesh wafer, wherein a mesh membrane is formed on the mesh wafer; bonding the MEMS microphone wafer with the mesh wafer; forming a back hole for the mesh membrane in the mesh wafer; etching the sacrificial layer in the MEMS microphone wafer to release the diaphragm and the back plate; singulating the MEMS microphone wafer and the mesh wafer to form a MEMS microphone device including a MEMS microphone chip and a monolithically integrated mesh membrane; and mounting the MEMS microphone device in a housing, wherein the housing has an acoustic port, and the mesh membrane is arranged between the MEMS microphone chip and the acoustic port as a particle filter for the MEMS microphone chip.

Alternatively or optionally, preparing a mesh wafer further includes: placing a bonding layer on the mesh membrane, and wherein the MEMS microphone wafer is bonded with the mesh wafer via the bonding layer, and forming a back hole for the mesh membrane in the mesh wafer further includes: etching the bonding layer to release the mesh membrane.

According to a third aspect of the present invention, there is provided an electronic apparatus, which comprises a MEMS microphone according to any embodiment or manufactured by using the method according to any embodiment.

According to an embodiment, a relatively thin mesh filter can be provided to a MEMS microphone with relatively high reliability.

Further features of the present invention and advantages thereof will become apparent from the following detailed description of exemplary embodiments according to the present invention with reference to the attached drawings.

BRIEF DISCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
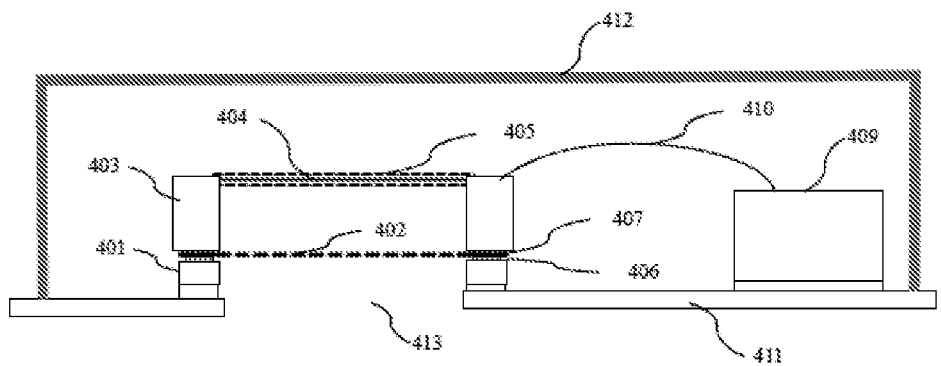
FIG. 1 shows a schematic diagram of a MEMS microphone according to an embodiment.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Examples and embodiments will be described with reference to the drawings.

FIG. 1 shows a schematic diagram of a MEMS microphone according to an embodiment.

As shown in FIG. 1, the MEMS microphone comprises a MEMS microphone device and a housing.

The MEMS microphone device includes a MEMS microphone chip and a mesh membrane 402. The mesh membrane 402 is monolithically integrated with the MEMS microphone chip. For example, the MEMS microphone chip may include a first substrate 403, at least one backplate 405 and at least one diaphragm 404. The mesh membrane 402 is formed on a second substrate 401. The mesh membrane 402 and the second substrate 401 are bonded to the first substrate 403, to form a monolithic integration.

For example, the mesh membrane 402 is bonded to the second substrate 401 via a dielectric layer 406 and is bonded to the first substrate 402 via an intermediate bonding layer 407 such as an adhesive, metal, alloy, solder or glass frit. Alternatively, a direct bonding between the mesh membrane 402, the second substrate 401 and the first substrate 403 is also possible.

The housing includes an acoustic port 413. The MEMS microphone device is mounted in the housing. The housing may include a package substrate 411 and a lid 412. The package substrate 411 and a lid 412 form a housing cavity. Generally, the acoustic port is arranged in the package substrate.

As shown in FIG. 1, the mesh membrane is arranged between the MEMS microphone chip and the acoustic port as a particle filter for the MEMS microphone chip.

The MEMS microphone may further include an ASIC 409. The MEMS microphone device is connected with the ASIC 409 via wire 410.

Figure 2:
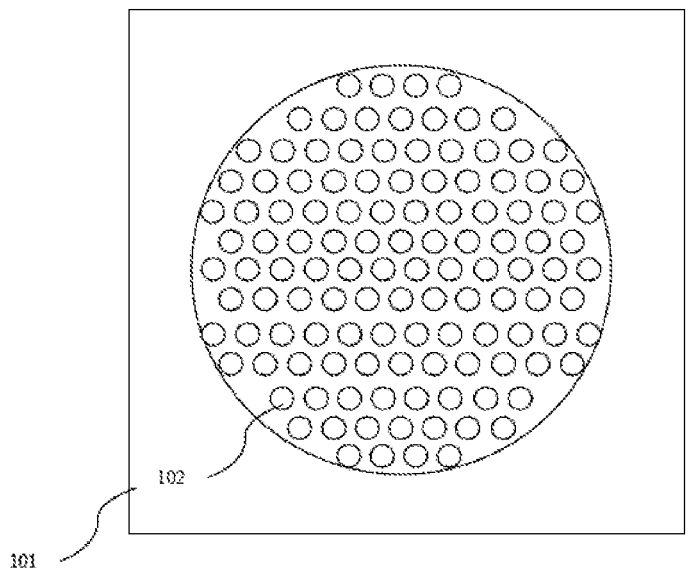
FIG. 2 shows a schematic bottom view of a MEMS microphone device with a monolithically integrated mesh membrane filter according to an embodiment.

FIG. 2 shows a schematic bottom view of a MEMS microphone device 101 with a monolithically integrated mesh membrane filter 102 according to an embodiment. The MEMS microphone device 101 may be that described in FIG. 1. As shown in FIG. 1, the MEMS microphone device 101 may include a mesh membrane filter 102. The mesh membrane filter 102 may include the mesh membrane 402 of FIG. 1. Although it is not shown, the MEMS microphone device 101 may further include a MEMS microphone chip. The mesh membrane 102 is monolithically integrated with the MEMS microphone chip.

Figure 3:
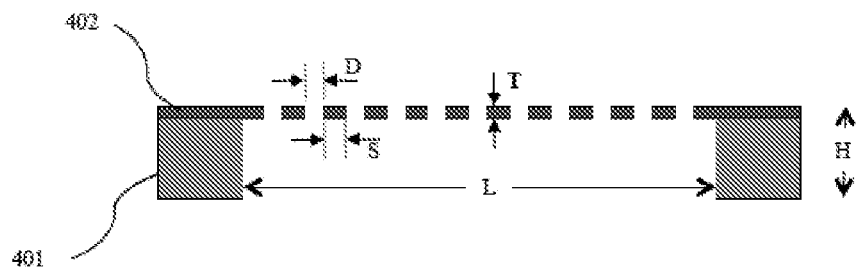
FIG. 3 shows a schematic cross-sectional view of a monolithically integrated mesh membrane filter according to an embodiment.

FIG. 3 shows a schematic cross-sectional view of a monolithically integrated mesh membrane filter according to an embodiment. As shown in FIG. 3, the mesh membrane filter may include a substrate 401 and a mesh membrane 402.

FIG. 3 also shows that dimension of the mesh membrane 402. D is the perforation hole size (diameter) of holes in the mesh membrane 402. The perforation hole size D is 1-10 μm, and preferably, 3-5 μm, in order to prevent killer particles from entering the air gap of the MEMS microphone device. S is the space between two adjacent holes. T is the thickness of the mesh membrane 402. The thickness T is in range of 0.1-10 μm and preferably, 0.3-1 μm, so as to provide a balance between filtering and performance. H is the height of the mesh membrane filter including the mesh membrane and the substrate 401. L is the diameter of the perforated part of the mesh membrane 402.

The material of the mesh membrane 402 may be selected from at least one of $Si_xN_y$, polySi, metal, alloy and polymer. A person skilled in art will be able to choose appropriate x and y for $Si_xN_y$, under the teaching of this description.

In an example, a hole array in the mesh membrane 402 is 60deg placed, so as to provide a maximum perforation rate. FIGS. 4-8 show schematic arrangements of hole arrays for a monolithically integrated mesh membrane filter according to an embodiment.

Figure 4:
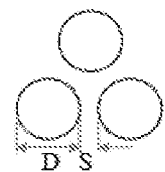
FIGS. 4-8 show schematic arrangements of hole arrays for a monolithically integrated mesh membrane filter according to an embodiment.
Figure 5:
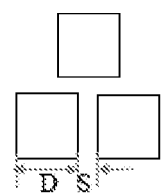
Figure 6:
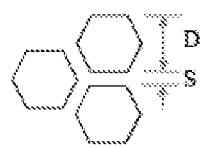
Figure 7:
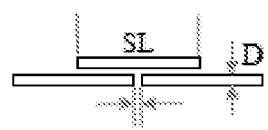
Figure 8:
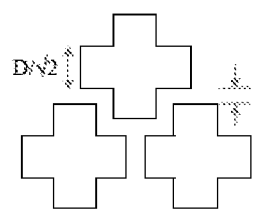

FIG. 4 shows an array of round holes. FIG. 5. shows an array of square holes. FIG. 6. shows an array of hexagon holes. FIG. 7 shows an array of slit holes. FIG. 8 shows an array of cross holes.

The mesh membrane 402 and the second substrate 401 can be bonded to the first substrate 403 by at least one of wafer bonding, fusion bonding and intermediate layer bonding.

Figure 9:
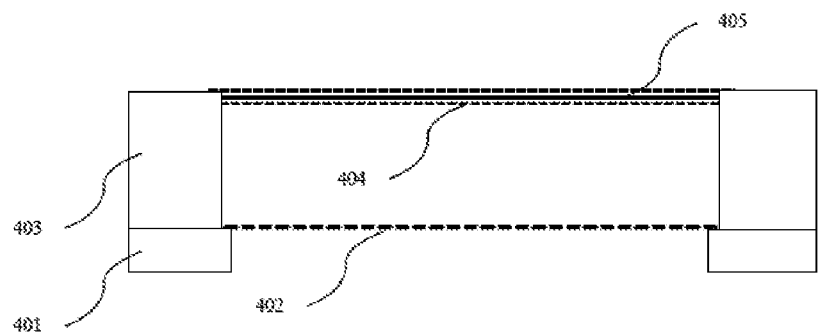
FIG. 9 shows a schematic cross-sectional view of a MEMS microphone device according to an embodiment.

FIG. 9 shows that the mesh membrane 402 and the second substrate 401 are bonded to the first substrate 403 by direct wafer bonding or fusion bonding.

Figure 10:
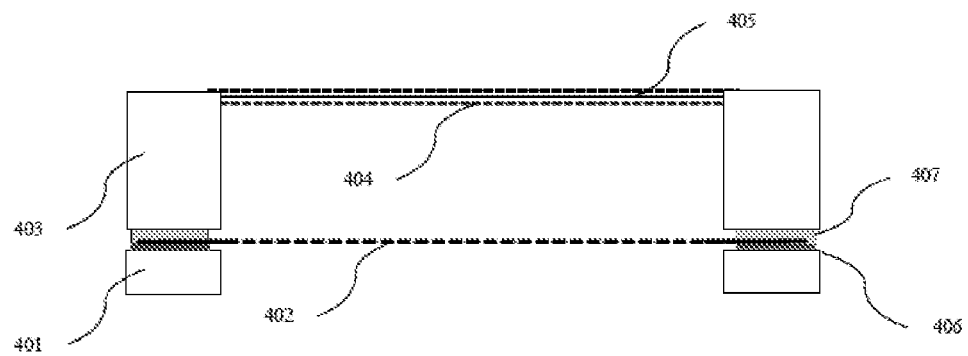
FIG. 10 shows a schematic cross-sectional view of a MEMS microphone device according to another embodiment.

FIG. 10 shows that the mesh membrane 402 and the second substrate 401 are bonded to the first substrate 403 by intermediate layer bonding. As shown in FIG. 10, the mesh membrane 402 is bonded to the second substrate 401 via a dielectric layer 406. The mesh membrane 402 and the second substrate 401 are bonded with the first substrate 403 via a bonding layer 407. For example, the intermediate bonding layer may be an adhesive, metal, alloy, solder or glass frit layer, or an other layer which can be conceived by a person skilled in the art.

FIGS. 11-16 show processes of manufacturing a MEMS microphone according to an embodiment.

Figure 11:
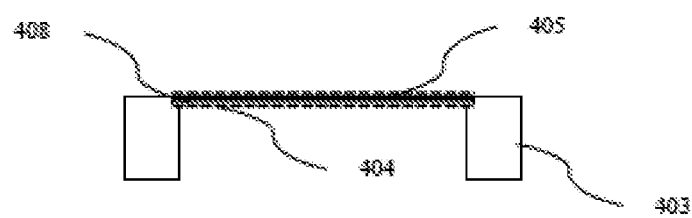
FIGS. 11-16 show processes of manufacturing a MEMS microphone according to an embodiment.

As shown in FIG. 11, a MEMS microphone wafer 403 is prepared, wherein the sacrificial layer 408 between a diaphragm 404 and a backplate 405 of the MEMS microphone wafer are not released. In this regard, the diaphragm and backplate can be supported and protected by the sacrificial layer. This may improve the yield of the final products. The sacrificial layer can be SiO.

Figure 12:
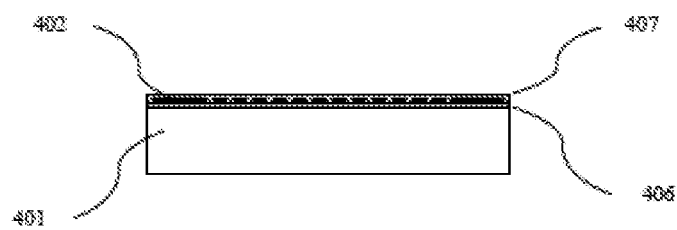

As show in FIG. 12, a mesh wafer 401 is prepared. A mesh membrane 402 is formed on the mesh wafer.

For example, the dielectric layer 406 of $SiO_2$ may first be deposited on the mesh wafer 401. Then, a mesh layer 402 is formed on the dielectric layer 406. The material of the mesh layer 402 may be polySi, SixNy, metal, alloy, or polymer. Next, the mesh layer 402 is patterned to form holes therein.

For example, a bonding layer 407 is placed on the mesh membrane 402. The bonding layer 407 can be deposited or coated. The bonding layer 407 may be $SiO_2$, or polymer such as BCB/PI/PBO/photoresist. Here, an intermediate bonding layer is used to bond the filter with the MEMS microphone chip. As described above, a direct wafer bonding is also possible. For example, if the bonding layer 407 may be $SiO_2$, it can directly be bonded with the MEMS microphone wafer 403 of Si.

Figure 13:
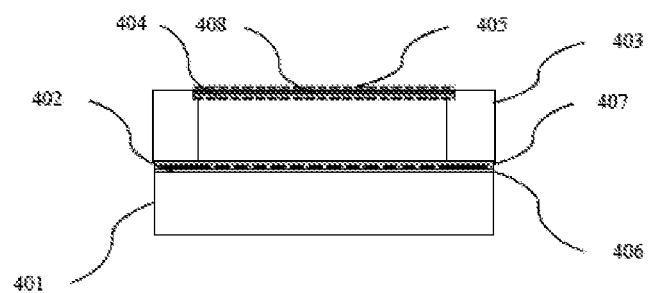

As shown in FIG. 13, the MEMS microphone wafer 403 is bonded with the mesh wafer 401 (including the mesh membrane 402). For example, the MEMS microphone wafer 403 is bonded with the mesh wafer 401 via the bonding layer 407.

Figure 14:
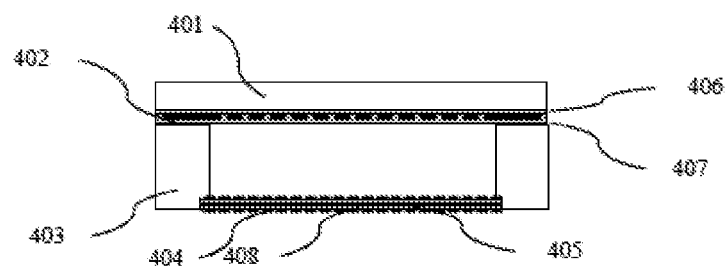
Figure 15:
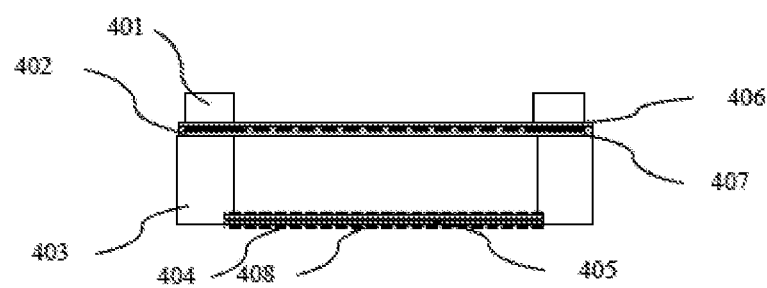

As shown in FIGS. 14, 15, a back hole for the mesh membrane 402 is formed in the mesh wafer 401. As shown in FIG. 14, the mesh wafer 401 may first be thinned. As shown in FIG. 15, the back hole is formed in the mesh wafer 401 for the mesh membrane 402.

Optionally, scribe streets may also be formed in the mesh wafer 401.

Figure 16:
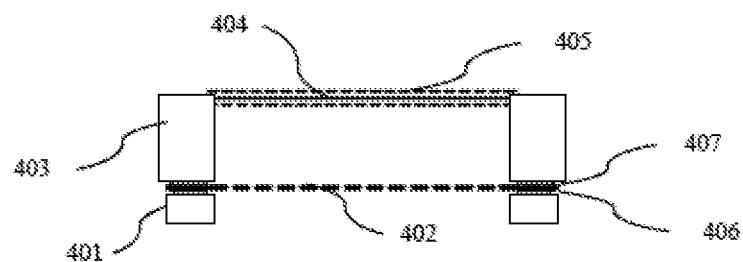

As shown in FIG. 16, the sacrificial layer 408 in the MEMS microphone wafer 403 is etched to release the diaphragm 404 and the back plate 405.

Here, the bonding layers 406, 407 may also be etched to release the mesh membrane 402. In some cases, the bonding layer 406, 407 may be omitted, and thus this etching step may omitted, too.

Next, the MEMS microphone wafer 403 and the mesh wafer 401 are singulated to form a MEMS microphone device. The MEMS microphone device includes a MEMS microphone chip and a monolithically integrated mesh membrane. For example, the MEMS microphone device may be that shown in FIG. 1, the MEMS microphone wafer 403 forms the first substrate and the mesh wafer 401 forms the second substrate.

Finally, the MEMS microphone device is mounted in a housing, to finish a MEMS microphone. The MEMS microphone may be that shown in FIG. 1. The housing has an acoustic port 413, and the mesh membrane 402 is arranged between the MEMS microphone chip and the acoustic port 413 as a particle filter for the MEMS microphone chip.

Generally, SNR will drop as the thickness of the filter increases. A thick membrane of a filter will cause a significant SNR degradation. In the prior art, a mesh membrane is manufactured directly in a Si substrate or is manufactured during a packaging or PCB process. It is very difficult to provide a thin mesh membrane with reasonable yield, cost and/or reliability.

In the embodiments, the mesh membrane is manufactured through wafer micromachining, and it monolithically integrated with the MEMS microphone chip. So, it may relieve the problems at least in one aspect.

In addition, the overall size of the MEMS microphone may be reduced because the particle filter is manufactured at wafer level.

In another embodiment, an electronic apparatus is provided, which comprises a MEMS microphone as described above or manufactured by using the method as described above. The electronic apparatus can be a mobile phone, pad, computer and so on.

Although some specific embodiments of the present invention have been demonstrated in detail with examples, it should be understood by a person skilled in the art that the above examples are only intended to be illustrative but not to limit the scope of the present invention.

What is claimed is:

1. A method for manufacturing a MEMS microphone, including:
preparing a MEMS microphone wafer, wherein the sacrificial layer between a diaphragm and a backplate of the MEMS microphone wafer are not released;
preparing a mesh wafer, wherein a mesh membrane is formed on the mesh wafer;
bonding the MEMS microphone wafer with the mesh wafer;
forming a back hole for the mesh membrane in the mesh wafer;
etching the sacrificial layer in the MEMS microphone wafer to release the diaphragm and the back plate;
singulating the MEMS microphone wafer and the mesh wafer to form a MEMS microphone device including a MEMS microphone chip and a monolithically integrated mesh membrane; and
mounting the MEMS microphone device in a housing, wherein the housing has an acoustic port, and the mesh membrane is arranged between the MEMS microphone chip and the acoustic port as a particle filter for the MEMS microphone chip.

2. An MEMS microphone manufactured through the method of claim 1.

3. The MEMS microphone according to claim 2, wherein the MEMS microphone chip includes a first substrate, at least one backplate and at least one diaphragm, and the mesh membrane is formed on a second substrate; and
wherein the mesh membrane and the second substrate are bonded to the first substrate.

4. The MEMS microphone according to claim 3, wherein the mesh membrane and the second substrate are bonded to the first substrate by at least one of wafer bonding, fusion bonding and intermediate layer bonding.

5. The MEMS microphone according to claim 2, wherein the housing includes a package substrate and a lid, which form a housing cavity, and the acoustic port is in the package substrate.

6. The MEMS microphone according to claim 2, wherein the mesh membrane has a perforation hole size of 1-10 um, and the mesh membrane has a thickness in range of 0.1-10 um.

7. The MEMS microphone according to claim 2, wherein a material of the mesh membrane is at least one of SixNy, polySi, metal, alloy and polymer.

8. The method according to claim 1, wherein preparing a mesh wafer further includes:
  placing a bonding layer on the mesh membrane, and
  wherein the MEMS microphone wafer is bonded with the mesh wafer via the bonding layer,
  and forming a back hole for the mesh membrane in the mesh wafer further includes:
  etching the bonding layer to release the mesh membrane.

9. An electronic apparatus, which comprises a MEMS microphone according to claim 2.

10. An electronic apparatus, which comprises a MEMS microphone manufactured by using the method according to claim 1.

* * * * *